(12) United States Patent
Myers, III et al.

(10) Patent No.: US 11,629,399 B2
(45) Date of Patent: Apr. 18, 2023

(54) CONVERTIBLE MAGNETICS FOR ROTARY CATHODE

(71) Applicant: VAPOR TECHNOLOGIES, INC., Longmont, CO (US)

(72) Inventors: Sterling Walker Myers, III, Denver, CO (US); Zachary Zembower, Northglenn, CO (US)

(73) Assignee: Vapor Technologies, Inc., Longmont, CO (US)

( * ) Notice: Subject to any disclaimer, the term of this patent is extended or adjusted under 35 U.S.C. 154(b) by 0 days.

(21) Appl. No.: 17/197,622

(22) Filed: Mar. 10, 2021

(65) Prior Publication Data

US 2021/0285090 A1    Sep. 16, 2021

Related U.S. Application Data

(60) Provisional application No. 62/989,960, filed on Mar. 16, 2020.

(51) Int. Cl.
*H01J 37/34* (2006.01)
*C23C 14/34* (2006.01)
*C23C 14/35* (2006.01)

(52) U.S. Cl.
CPC ........ *C23C 14/3407* (2013.01); *C23C 14/351* (2013.01); *C23C 14/352* (2013.01); *H01J 37/342* (2013.01)

(58) Field of Classification Search
None
See application file for complete search history.

(56) References Cited

U.S. PATENT DOCUMENTS 5,108,574 A * 4/1992 Kirs ................... H01J 37/3497
                                                          204/192.12
5,215,638 A   6/1993 Hausler
(Continued)

FOREIGN PATENT DOCUMENTS

| EP | 2 037 000 A2 | 3/2009 |
| GB | 2 255 105 A | 10/1992 |
| WO | 2011/060748 A1 | 5/2011 |

OTHER PUBLICATIONS

Extended European Search Report dated Aug. 25, 2021 for EP Appn. No. 21161873.1, 9 pgs.

*Primary Examiner* — Jason Berman
(74) *Attorney, Agent, or Firm* — Brooks Kushman P.C.

(57) ABSTRACT

A rotary cathode assembly includes a cathode having a tube shape and defining a hollow center, a shield surrounding the cathode, the shield defining an access opening that exposes a portion of the cathode, and a rotary magnet subassembly disposed within the hollow center of the cathode. The rotary magnet subassembly includes a first magnetic component having a first magnetic field strength and a second magnetic component having a second magnetic field strength. The first magnetic field strength is greater than the second magnetic field strength. Characteristically, the first magnet component and the second magnetic component are rotatable between a first position in which the first magnetic component faces the access opening and a second position in which the second magnetic component faces the access opening. A coating system including the rotary cathode assembly is also provided.

23 Claims, 4 Drawing Sheets

(56) References Cited

U.S. PATENT DOCUMENTS

| | | | | |
|---|---|---|---|---|
| 5,527,439 | A | * | 6/1996 | Sieck .................. H01J 37/3405 |
| | | | | 204/192.22 |
| 6,375,860 | B1 | * | 4/2002 | Ohkawa .............. C23C 16/4401 |
| | | | | 118/723 E |
| 6,488,824 | B1 | * | 12/2002 | Hollars .................. C23C 14/35 |
| | | | | 204/192.12 |
| 6,896,773 | B2 | * | 5/2005 | Chistyakov ........... C23C 14/228 |
| | | | | 204/192.12 |
| 2010/0012487 | A1 | * | 1/2010 | Heinrich ............ H01J 37/3402 |
| | | | | 204/298.2 |
| 2010/0187104 | A1 | * | 7/2010 | Tamagaki ............. C23C 14/044 |
| | | | | 204/298.02 |
| 2012/0211352 | A1 | * | 8/2012 | Premendra ............ H01J 37/342 |
| | | | | 204/192.12 |

* cited by examiner

CONVERTIBLE MAGNETICS FOR ROTARY CATHODE

CROSS-REFERENCE TO RELATED APPLICATIONS

This application claims the benefit of U.S. provisional application Ser. No. 62/989,960 filed Mar. 16, 2020, the disclosure of which is hereby incorporated in its entirety by reference herein.

TECHNICAL FIELD

In at least one aspect, a cathode assembly that can be used for both cathodic arc coating and magnetron sputtering coating systems is provided.

BACKGROUND

Vacuum coating systems such as magnetron sputtering systems, arc deposition systems, chemical vapor deposition systems, and the like are sold as separate systems. Such coating systems are expensive and are frequently underutilized.

Accordingly, there is a need to provide a novel design to expand the applications of coating systems so as to minimize associated costs.

SUMMARY

In at least one aspect, a rotary cathode assembly is provided. The rotary cathode assembly includes a cathode having a tube shape and defining a hollow center, a shield surrounding the cathode, the shield defining an access opening that exposes a portion of the cathode, and a rotary magnet subassembly disposed within the hollow center of the cathode. The rotary magnet subassembly includes a first magnet component having a first magnetic field strength and a second magnetic component having a second magnetic field strength. The first magnetic field strength is greater than the second magnetic field strength. Characteristically, the first magnet component and the second magnetic component are rotatable between a first position in which the first magnetic component faces the access opening and a second position in which the second magnetic component faces the access opening.

In another aspect, a coating system that can operate in a magnetron sputtering mode or in a cathodic arc deposition mode is provided. The coating system includes a coating chamber and the rotary cathode assembly set forth herein.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein.

DETAILED DESCRIPTION

Figure 1A:
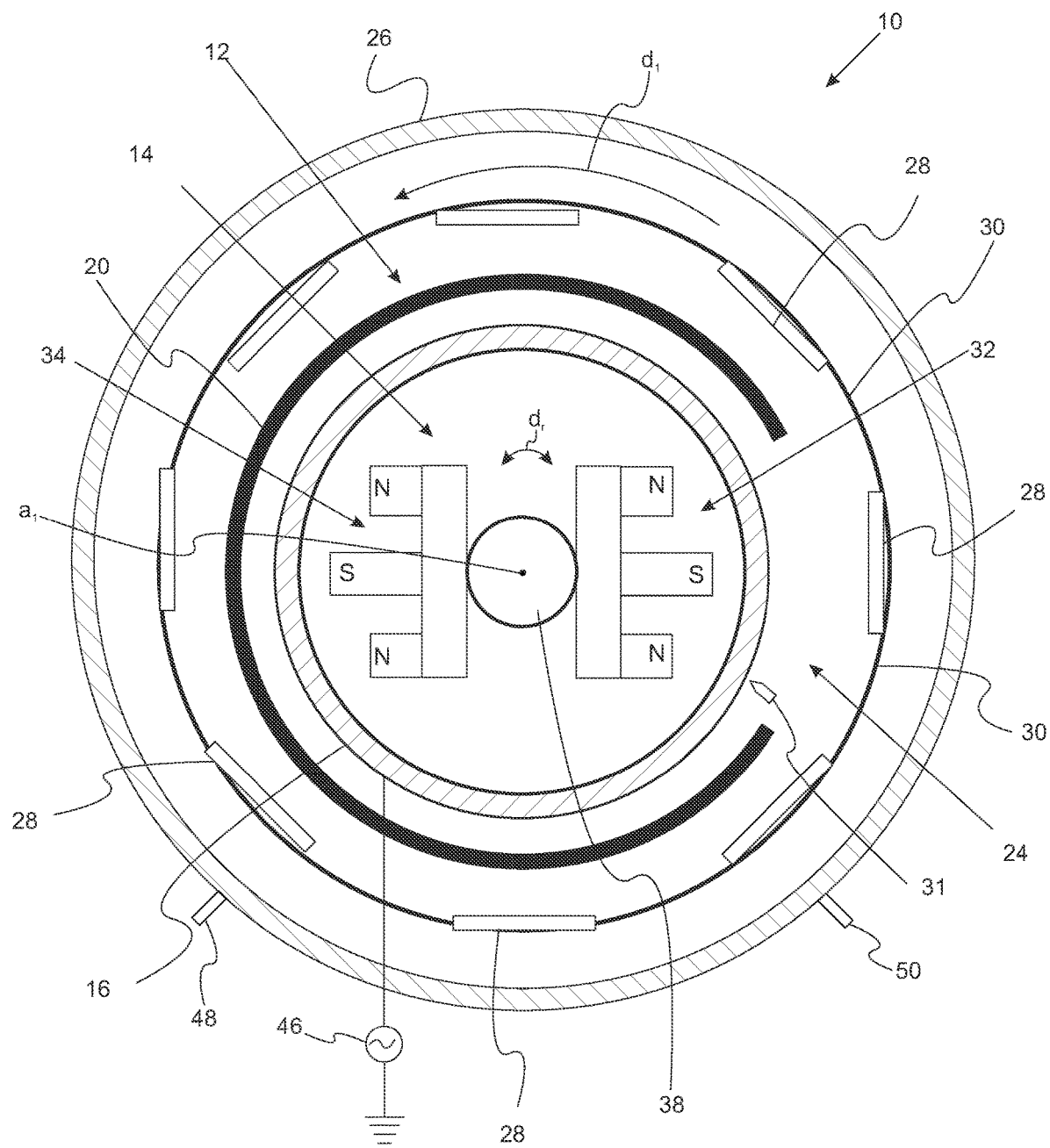
FIG. 1A is a cross sectional view of a circular coating system that includes a rotary cathode assembly that can be used for cathodic arc coating and sputter coating.

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

For any device described herein, linear dimensions and angles can be constructed with plus or minus 50 percent of the values indicated rounded to or truncated to two significant figures of the value provided in the examples. In a refinement, linear dimensions and angles can be constructed with plus or minus 30 percent of the values indicated rounded to or truncated to two significant figures of the value provided in the examples. In another refinement, linear dimensions and angles can be constructed with plus or minus 10 percent of the values indicated rounded to or truncated to two significant figures of the value provided in the examples.

Throughout this application, where publications are referenced, the disclosures of these publications in their entireties are hereby incorporated by reference into this application to more fully describe the state of the art to which this invention pertains.

Figure 1B:
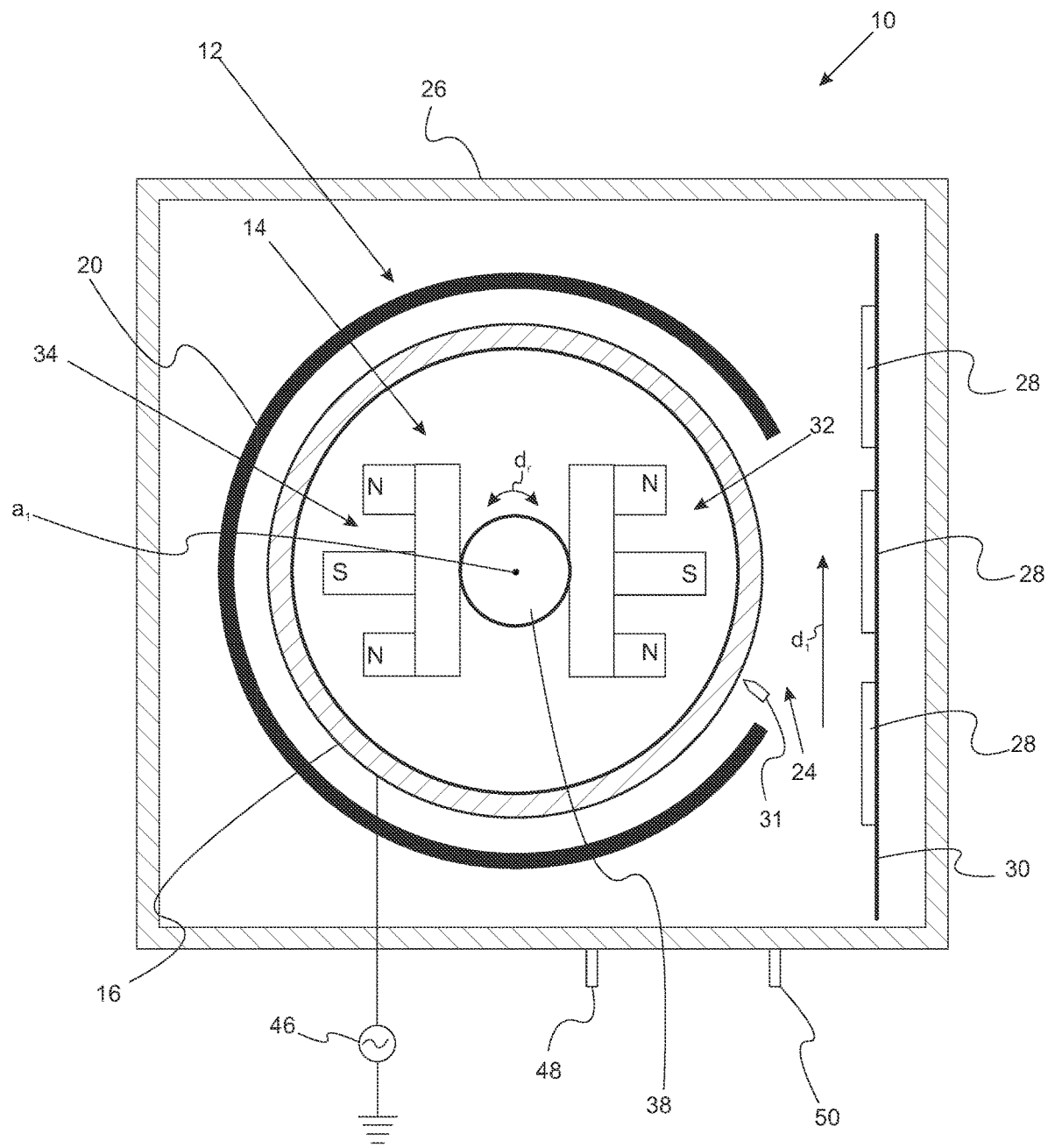
FIG. 1B is a cross sectional view of a rectangular coating system that includes a rotary cathode assembly that can be used for cathodic arc coating and sputter coating.
Figure 1C:
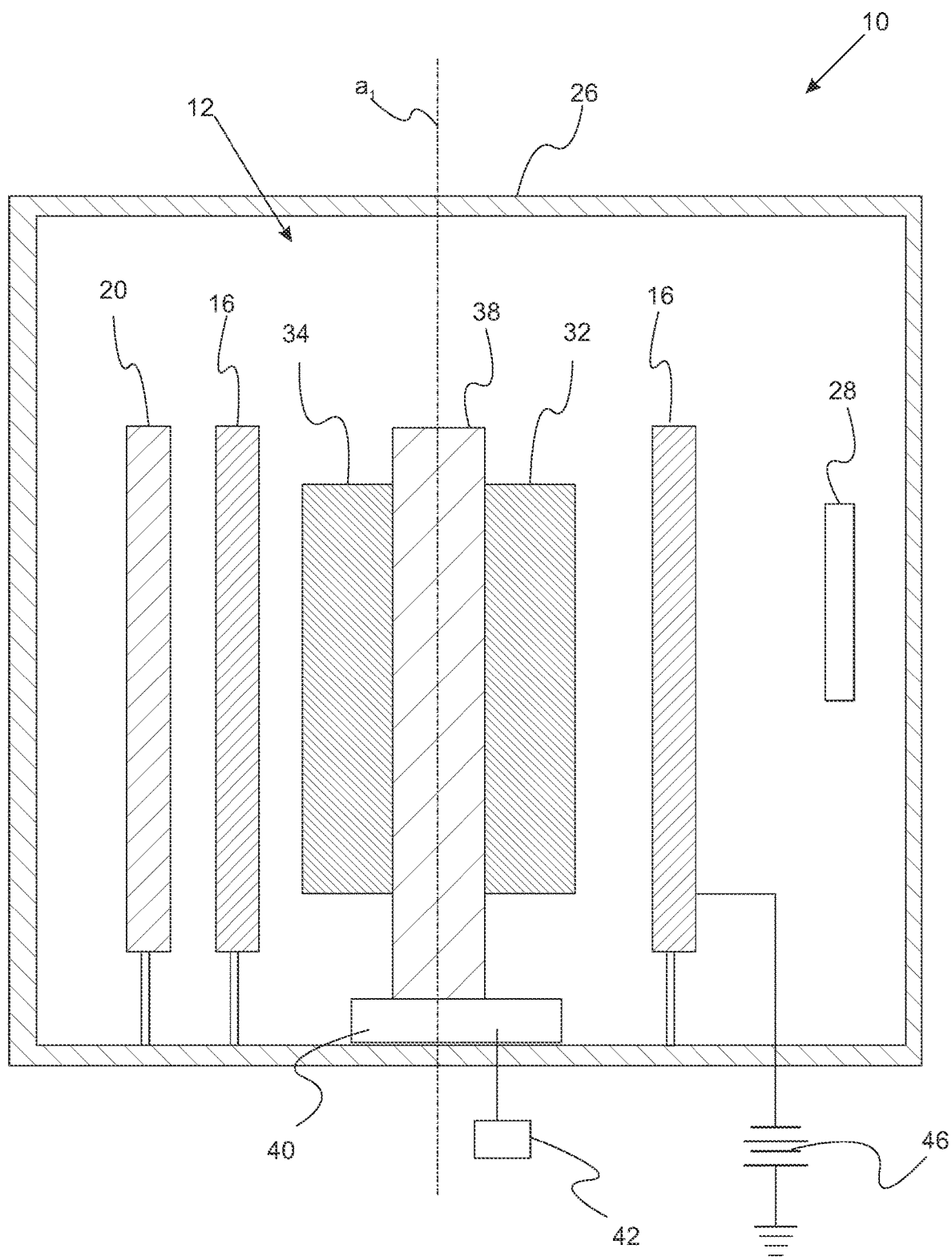
FIG. 1C is a cross sectional view of a coating system perpendicular to the view of FIG. 1A that includes a rotary cathode assembly that can be used for cathodic arc coating and sputter coating.
Figure 2:
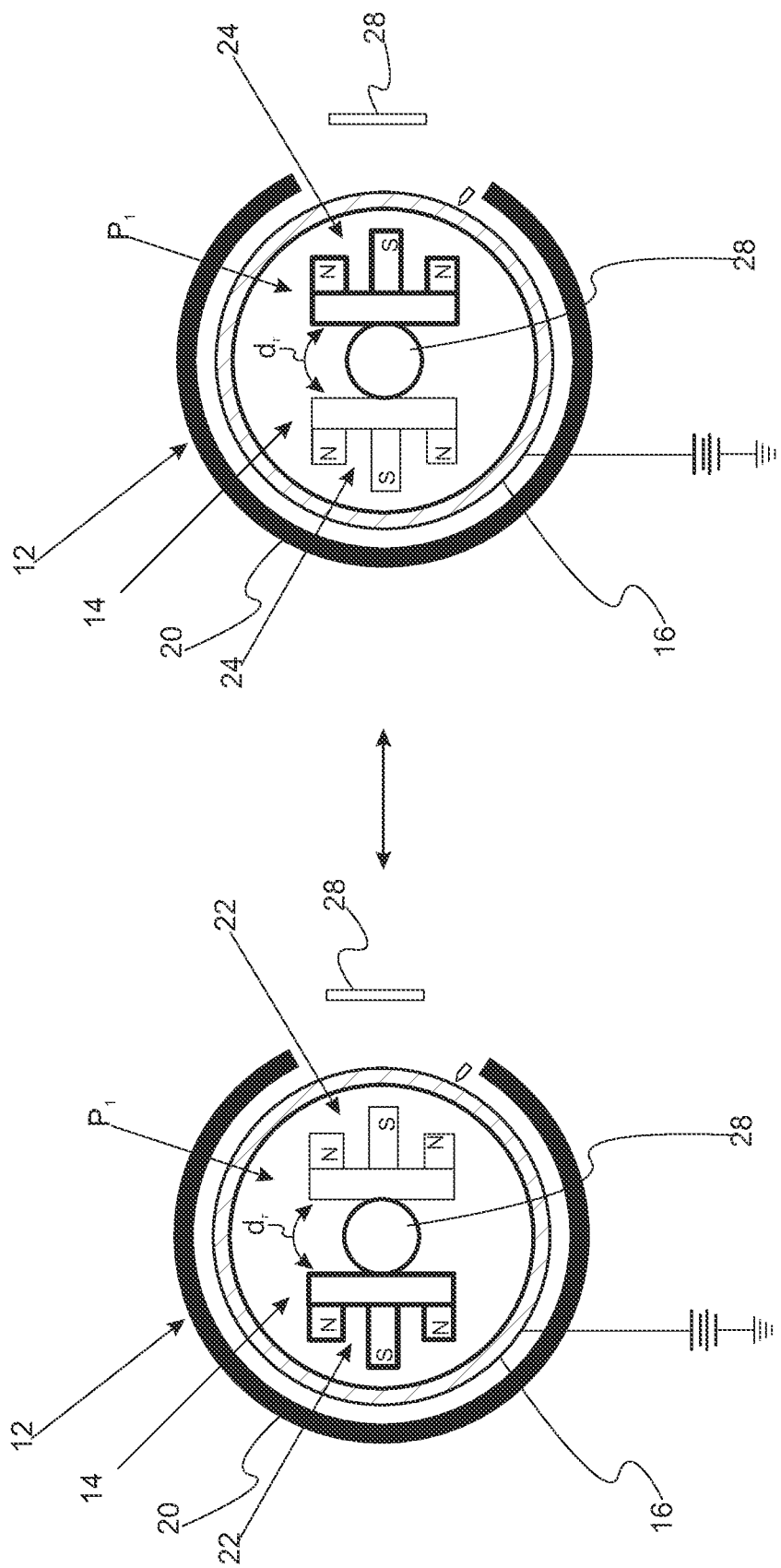
FIG. 2 is a cross sectional view showing repositioning of the rotary cathode assembly in the coating systems of FIGS. 1A and 1B.

With reference to FIGS. 1A and 1B, schematic illustrations of a coating system that can be used for sputter coating and cathodic arc deposition coatings are provided. Coating system 10 that includes a rotary cathode assembly 12 that can be used for cathodic arc coating and sputter coating. Rotary cathode assembly 12 includes rotary magnet subassembly 14 and cathode 16. Cathode 16 has a tubular shape and is centered about central axis $a_1$. Typically, cathode 16 has a circular cross-section. Shield 20 is disposed around rotary cathode assembly 12. In a refinement, shield 20 is an electrically floating shield. Shield 20 defines an access opening 24. The cathode assembly 12 is mounted in coating chamber 26. Although the present invention is not limited by the type of coating chamber, FIG. 1A depicts a chamber with a circular cross-section and FIG. 1B depicts a chamber with a rectangular cross-section. During operation substrates 28 pass in front of access opening 24 to provide a line-of-sight path from a portion of a surface of cathode 16 to the substrates during coating deposition. Substrate carrier 30 moves the substrates as indicated along direction $d_1$. In FIG. 1A direction d1 is a circular trajectory while in FIG. 1B direction $d_1$ is a linear trajectory. In another variation, the trajectory can also be or a planetary three-axis trajectory. Arc striker 31 is also depicted in FIGS. 1A and 1B. Although the present invention is not limited by the dimensions of the coating chamber and components therein, cathode 16 typically has a diameter of at least 100 mm and typically less than about 1 m. Coating chamber 26 will have dimensions sufficient to accommodate the cathode and additional structure. Therefore, coating chamber can have a width (or diameter) of at least 200 mm. Typically, heights for coating chamber 26 are from 0.5 to 3 meters.

Still referring to FIGS. 1A and 1B, rotary magnet subassembly 14 includes a first magnetic component 32 having a first magnetic field strength and a second magnetic component 34 having a second magnetic field strength. Characteristically, the first magnetic field strength is greater than the second magnetic field strength. The higher magnetic field strength of first magnetic component 32 is suitable for magnetron sputtering while the lower magnetic field strength is more suitable for cathodic arc deposition. In a refinement, the magnetic field strength of the first magnetic component 32 is from about 50 to 500 Gauss while the magnetic field strength of the second magnetic component 22 is from about 10 to 100 Gauss.

With reference to FIGS. 1A, 1B, 1C, and 2, rotation of rotary magnet subassembly 14 is schematically illustrated. The first magnetic component and the second magnetic component are rotatable along direction dr between a first position $P_1$ in which the first magnetic component 32 faces the access opening 24 and a second position $P_2$ in which the second magnetic component 34 faces the access opening 24. First magnetic component 32 and second magnetic component 34 can be mounted on a rotatable support member 38 which is rotated by electric motor 40. In a variation, first magnetic component 32 and second magnetic component 34 can be mounted on a rotatable support member 38 which is rotated by a pneumatic actuator on a lever. In a refinement, a user operates a controller such that substrates 28 to be coated move in front of access opening 24 (i.e., the substrates are positioned in front of the access opening while being coated). A user operates controller 42 to position the first magnetic component 32 and the first magnetic component 34 for magnetron sputtering or cathodic arc deposition as required.

FIGS. 1A and 1B also depict power system 46 that power cathode 14 providing DC, Pulsed-DC and RF power thereto, gas port 48 for introducing gas as needed, and vacuum port 50. In a refinement, the power system outputs a first voltage in a first voltage range for cathodic arc and a first current in a first current range for cathodic arc deposition. In a further refinement, the power system also outputs a second voltage in a second voltage range and a second current in a second current range for magnetron sputtering. In still a further refinement, the first voltage range is from 20 to 40 voltage and the first current range is from 100 to 600 A and the second voltage range is from 300 to 1600 volts and the second current range is from 10 to 100 A. Typically, for magnetron sputtering and cathodic arc deposition the pressure is from about 1 mTorr to about 200 mTorr.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A rotary cathode assembly comprising:
    a cathode having a tube shape and defining a hollow center;
    a shield surrounding the cathode, the shield defining an access opening that exposes a portion of the cathode; and
    a rotary magnet subassembly disposed within the hollow center of the cathode, the rotary magnet subassembly includes a first magnetic component having a first magnetic field strength for magnetron sputtering and a second magnetic component having a second magnetic field strength for cathodic arc deposition such that the rotary cathode assembly operates in a magnetic sputtering mode or a cathodic arc deposition mode, the first magnetic field strength is greater than the second magnetic field strength, wherein the first magnetic component and the second magnetic component are rotatable between a first position in which the first magnetic component faces the access opening and the second magnetic component is shielded by the shield and a second position in which the second magnetic component faces the access opening and the first magnetic component is shielded by the shield; and
    a user operated controller configured to for a user to select the magnetic sputtering mode or the cathodic arc deposition mode.

2. The rotary cathode assembly of claim 1 wherein the shield is electrically floating.

3. The rotary cathode assembly of claim 1 wherein the first magnetic field strength is from about 50 to 500 Gauss.

4. The rotary cathode assembly of claim 3 wherein the second magnetic field strength is from about 10 to 100 Gauss.

5. The rotary cathode assembly of claim 1 wherein a substrate to be coated is positioned in front of the access opening.

6. The rotary cathode assembly of claim 5 wherein the substrate follows a linear trajectory.

7. The rotary cathode assembly of claim 5 wherein the substrate follows a circular trajectory or a planetary three-axis trajectory.

8. The rotary cathode assembly of claim 1 wherein the first magnetic component and the second magnetic component are mounted on a support member that is rotated by an electric motor.

9. The rotary cathode assembly of claim 1 wherein the cathode has a circular cross section.

10. The rotary cathode assembly of claim 1 wherein the cathode is powered by a power system, the power system outputting a first voltage in a first voltage range for cathodic arc and a first current in a first current range for cathodic arc deposition, the power system also outputting a second voltage in a second voltage range and a second current in a second current range for magnetron sputtering.

11. The rotary cathode assembly of claim 10 wherein the first voltage range is from 20 to 40 voltage and the first current range is from 100 to 600 A and wherein the second voltage range is from 300 to 1600 volts and the second current range is from 10 to 100 A.

12. A coating system comprising:
a coating chamber; and
a rotary cathode assembly disposed in the coating chamber, the rotary cathode assembly including:
  a cathode having a tube shape and defining a hollow center;
  a shield surrounding the cathode, the shield defining an access opening that exposes a portion of the cathode; and
  a rotary magnet subassembly disposed within the hollow center of the cathode, the rotary magnet subassembly includes a first magnetic component having a first magnetic field strength for magnetron sputtering and a second magnetic component having a second magnetic field strength for cathodic arc deposition such that the coating system operates in a magnetic sputtering mode or a cathodic arc deposition mode, the first magnetic field strength is greater than the second magnetic field strength, wherein the first magnetic component and the second magnetic component are rotatable between a first position in which the first magnetic component faces the access opening and the second magnetic component is shielded by the shield and a second position in which the second magnetic component faces the access opening and the first magnetic component is shielded by the shield; and
a user operated controller configured for a user to select the magnetic sputtering mode or the cathodic arc deposition mode.

13. The coating system of claim 12 wherein the shield is electrically floating.

14. The coating system of claim 12 wherein the first magnetic field strength is from about 50 to 500 Gauss.

15. The coating system of claim 14 wherein the second magnetic field strength is from about 10 to 100 Gauss.

16. The coating system of claim 12 wherein a substrate to be coated is positioned in front of the access opening.

17. The coating system of claim 16 wherein the substrate follows a linear trajectory.

18. The coating system of claim 16 wherein the substrate follows a circular trajectory.

19. The coating system of claim 12 wherein the first magnetic component and the second magnetic component are mounted on a support member that is rotated by an electric motor or a pneumatic actuator on a lever.

20. The rotary cathode assembly of claim 12 wherein the cathode is powered by a power system, the power system outputting a first voltage in a first voltage range for cathodic arc and a first current in a first current range for cathodic arc deposition, the power system also outputting a second voltage in a second voltage range and a second current in a second current range for magnetron sputtering.

21. The rotary cathode assembly of claim 20 wherein the first voltage range is from 20 to 40 voltage and the first current range is from 100 to 600 A and wherein the second voltage range is from 300 to 1600 volts and the second current range is from 10 to 100 A.

22. The rotary cathode assembly of claim 1 configured such that substrates pass in front of the access opening to provide a line-of-sight path from a portion of a surface of the cathode to substrates during coating deposition.

23. The rotary cathode assembly of claim 12 configured such that substrates pass in front of the access opening to provide a line-of-sight path from a portion of a surface of the cathode to substrates during coating deposition.

* * * * *